United States Patent [19]

Leipold et al.

[11] Patent Number: 5,266,840
[45] Date of Patent: Nov. 30, 1993

[54] CIRCUIT FOR DETECTING THE FAILURE OF A LOAD WHICH IS CONNECTED IN SERIES WITH AN ELECTRONIC SWITCH

[75] Inventors: Ludwig Leipold; Rainald Sander; Jenoe Tihanyi; Roland Weber, all of Munich, Fed. Rep. of Germany

[73] Assignee: Siemens Aktiengesellschaft, Munich, Fed. Rep. of Germany

[21] Appl. No.: 999,687

[22] Filed: Dec. 31, 1992

Related U.S. Application Data

[63] Continuation of Ser. No. 750,715, Aug. 20, 1991, abandoned, which is a continuation of Ser. No. 413,595, Sep. 28, 1989, abandoned.

[30] Foreign Application Priority Data

Oct. 25, 1988 [EP] European Pat. Off. ............ 88117774

[51] Int. Cl.⁵ ................................................. H01J 1/00
[52] U.S. Cl. .................................... 307/125; 307/10.8; 315/82; 315/131; 340/642
[58] Field of Search ................ 307/9.1, 10.1, 10.8, 307/125; 340/458, 641, 642; 315/82, 129, 130, 131

[56] References Cited

U.S. PATENT DOCUMENTS

| | | | |
|---|---|---|---|
| 3,728,705 | 4/1973 | Atkins | 315/82 |
| 4,173,750 | 11/1979 | Riba | 340/642 |
| 4,190,830 | 2/1980 | Bell | 307/10.8 |
| 4,686,423 | 8/1987 | Eydt | 307/10.1 |
| 4,745,339 | 5/1988 | Izawa et al. | 315/130 |

FOREIGN PATENT DOCUMENTS

| | | |
|---|---|---|
| 2548866 | 5/1977 | Fed. Rep. of Germany . |
| 2748323 | 5/1979 | Fed. Rep. of Germany . |
| 2446047 | 8/1980 | France . |
| 2460087 | 1/1981 | France . |

*Primary Examiner*—Jeffrey A. Gaffin
*Attorney, Agent, or Firm*—Hill, Steadman & Simpson

[57] ABSTRACT

A circuit for detecting the non-operating condition of a load which is connected in series with an electronic switch wherein a comparator has a first input which is connected to the junction point between the load and the electronic switch and has a second input which is a reference voltage such that when the load fails the comparator produces an output to indicate such condition and wherein the reference voltage is lower than the normal voltage when the load is operating properly and is higher than when the load is in the inoperative condition.

6 Claims, 1 Drawing Sheet

CIRCUIT FOR DETECTING THE FAILURE OF A LOAD WHICH IS CONNECTED IN SERIES WITH AN ELECTRONIC SWITCH

This is a continuation of application Ser. No. 07/750,715, filed Aug. 20, 1991 which is a continuation of Ser. No. 413,595, filed 9/28/89, both abandoned. 1. Field of the Invention This invention relates in general to a circuit for detecting the failure of a load which is connected in series with an electronic power switch.

2. Description of the Related Art

For many applications such as in motor vehicles, it is desirable to indicate the failure and outage of a load such as a filament bulb for the vehicle lighting so that an indication can be made on a control panel. Since the load is generally spatially removed from the control panel, the voltage at the load itself cannot be monitored because this requires additional lines that would have to be connected between the control panel and the load.

For prior art devices see French Publication 2,446,047, French Publication 2,460,087, German 25 48 866 and German 27 48 323.

SUMMARY OF THE INVENTION

It is an object of the present invention to provide a circuit arrangement which can detect the failure of a load such as the interruption of a load located at a remote point without the use of additional lines.

It is a feature of the present invention to provide a comparator which has one input to which a reference voltage source is connected and has a second input wherein a voltage between a power switch and a load occur and wherein the reference voltage V2 is smaller than the voltage V1 at the power switch during normal operation and the reference voltage is higher than the voltage at the power switch during failure of the load.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

DESCRIPTION OF THE PREFERRED EMBODIMENTS

Figure 1:
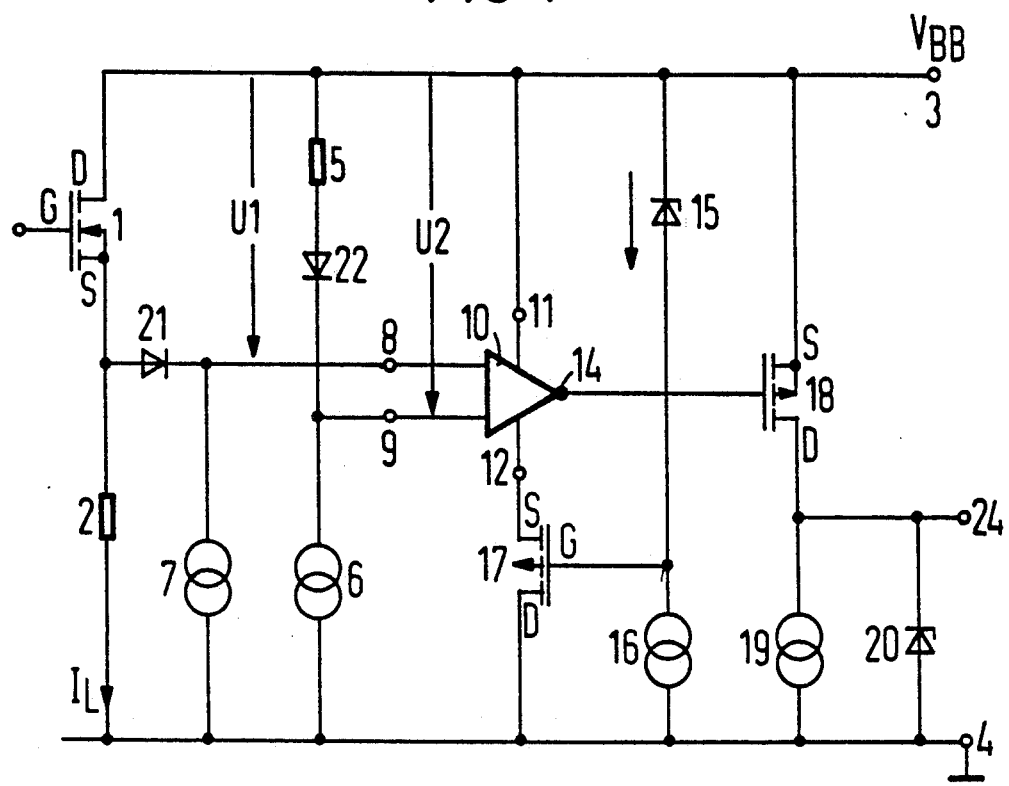
FIG. 1 is a schematic view illustrating the circuit of the invention.

FIG. 1 illustrates a circuit which contains a power MOSFET 1 which has its drain connected to terminals 3 and has its source connected to the load 2 which is to be monitored and the other side of the load is connected to terminal 4. A distribution voltage $V_{BB}$ is connected across terminals 3 and 4. A comparator 10 has a first input connected to input terminal 8 which is connected through diode 21 to the source of the MOSFET 1. The second input terminal 9 of the comparator 10 is connected to a reference voltage which is obtained from a reference voltage source composed of a series connection of a resistor 5 and a current source 6 and a diode 22 connected between terminals 3 and 4. A junction point between the diode 22 and the current source 6 is connected to the input terminal 9. The diodes 21 and 22 are not essential for the functioning of the circuit as will be explained in greater detail later. The comparator 10 has two supply voltage terminals 11 and 12. Terminal 11 is connected to terminal 3 and the output of the comparator is inverted and occurs at terminal 14.

During operation let it be assumed that MOSFET 1 is connected and that a load current $I_L$ passes through the load 2 which means that the load is operative. At the input terminal 8 of the comparator 10, a voltage U1 exists which corresponds to the drain-source voltage of MOSFET 1. At the input terminal 9, a reference voltage U2 exists which corresponds to the voltage across the resistor 5. The voltage across the resistor 5 is constant since the constant current source 6 connected in series with the resistor 5 draws a constant current independent of the amplitude of the distribution voltage $V_{BB}$.

The reference voltage U2 is selected such that it has an absolute value which is smaller than the voltage U1 across the MOSFET 1 when the load is operating properly and when nominal current flows through the MOSFET 1. When the load fails and is interrupted as, for example, when a light bulb has its filament burned out, the reference voltage at terminal 9 is selected such that its absolute value is higher than the voltage across the MOSFET when the load is interrupted. In other words, in the case of no load operation, these two voltages that exists across the power MOSFET 1 differ from each other and are evaluated as a criteria for a load outage by the comparator 10.

Thus, the load outage generates a change in voltage at the output 14 of the comparator 10 which serves as an indication for the no-load condition of the load 2. For definite determination of the voltage at the MOSFET in the case of the no-load condition depends on the current source 7. The current source 7 is selected such that its current is significantly lower than the load current. For example, it can be 100-1000 times lower than the load current.

When the voltage U1 has an absolute value higher than U2, a signal H appears at output terminal 14 of the comparator. If the voltage U1 has an absolute value lower than the voltage U2, a signal L occurs at output terminal 14. The output terminal 14 of the comparator 10 is connected to a MOSFET 18 which has its source connected to terminal 3 and its drain connected to a current source 19. If the L signal occurs at the output terminal 14, the MOSFET 18 conducts and at the output terminal 24 which is connected to a series function of the drain of the MOSFET and the current source 19, the voltage $V_{BB}$ exists. This voltage can be used as a signal to indicate that no load operation occurs and that the load 2 has failed. The voltage across terminals 24 and 4 can be limited by a Zener/breakdown diode 20 connected across the terminals 24 and 4.

The output signal of the comparator 10 can also be processed in other manners other than with the circuit comprising the diode 20, the current source 19 and the MOSFET 18.

So as to operate the comparator 10, a constant voltage source is necessary. The constant voltage source is composed of a Zener diode 15 which has its cathode terminal connected to terminal 3 and its anode connected to a terminal of a current source 16 which has its other side connected to terminal 4. The junction point between the diode 15 and the current source 16 is connected to the gate terminal of a n-channel MOSFET 17 which has its drain connected to terminal 4 and its source connected to the distribution voltage terminal 12 of the comparator 10. Since the current at the Zener diode 15 is constant, the gate-source bias voltage of the MOSFET 17 and the distribution voltage of the comparator 10 at terminals 11 and 12 will also be constant. The current source 16 limits the current via the Zener diode 15.

Expediently as previously mentioned, a diode 22 is inserted between the resistor 5 and the input terminal 9 and a diode 21 is inserted between the electronic switch 1 and the input terminal 8. These respectively increase the potentials at the input terminals 8 and 9 to a value suitable for the comparator 10.

Figure 2:
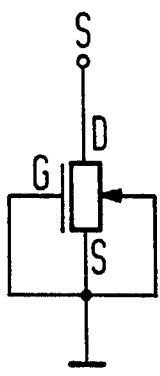
FIG. 2 is a detail schematic illustrating an individual component of the circuit arrangement.
Figure 3:
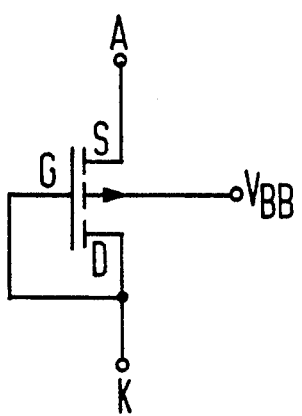
FIG. 3 is a detail circuit arrangement showing another component of the invention.

FIG. 2 shows that the current sources 6, 7, 16 and 19 can be composed of a n-channel-depletion-MOSFET which has its source terminal S connected to its gate terminal G. The substrate indicated by the arrow is also connected to the source potential. The diodes 21 and 22 can be constructed as MOS-diodes as shown in FIG. 3. The MOS diode is a p-channel-enhancement-FET which has a source terminal which forms the anode and which has a drain terminal which forms the cathode of the diode. The gate terminal G is connected to the drain terminal D. The substrate shown by the arrow has a voltage of $V_{BB}$.

Although the invention has been described with respect to preferred embodiments, it is not to be so limited as changes and modifications can be made which are within the full intended scope of the invention as defined by the appended claims.

We claim as our invention:

1. A circuit arrangement for detecting the no-load condition, comprising a load which is connected in series with a semiconductor power switch for controlling the current through the load, a comparator (10) which has a first input (9) to which a reference voltage source (5.6) is connected, and which has a second input (8) to which the voltage across the semiconductor power switch (1) is connected and the reference voltage is lower than the voltage which exists across the power switch when current flows through said power switch and said load and the reference voltage is higher than the voltage across the power switch when no current flows through said load, whereby an output terminal (24) is connected to said comparator to indicate when no current flows through said load, and wherein said load (2) is connected in parallel with a first constant current source (7) and the current through said first constant current source is lower than the currents through said bulb filament if the load has not failed and wherein there are no additional components between the applied voltage and said switch filament.

2. A circuit arrangement according to claim 4 wherein said reference voltage source is obtained of the junction point between a resistor (5) and a second constant current source (6).

3. A circuit arrangement according to claim 2, wherein a first diode (22) is connected between said resistor (5) and said second constant current source (6).

4. A circuit arrangement according to claim 3, wherein a second diode (21) is connected in series with said first current source (7) and the combination is connected in parallel with said load.

5. A circuit arrangement according to claim 3 wherein a voltage of a constant voltage source is connected to said comparator (10).

6. A circuit arrangement according to claim 5, wherein said constant voltage source comprises a Zener diode (15), and a third constant current source (16) which are connected in series and a MOSFET (17), and the anode of the Zener diode is connected to said third constant current source and to the gate terminal of said MOSFET, and the source terminal of the MOSFET is connected to a first voltage terminal (12) of said comparator and the cathode terminal of said Zener diode is connected to a second voltage terminal (11) of said comparator (10).

* * * * *